(12) United States Patent
Suto et al.

(10) Patent No.: US 12,369,349 B2
(45) Date of Patent: Jul. 22, 2025

(54) TRENCHED GATE DOUBLE DIFFUSED SEMICONDUCTOR DEVICE WITH CHANNEL IMPURITY CONCENTRATION ADJUSTMENT REGION

(71) Applicant: Hitachi Power Semiconductor Device, Ltd., Hitachi (JP)

(72) Inventors: Takeru Suto, Tokyo (JP); Naoki Watanabe, Tokyo (JP); Tomoka Suematsu, Tokyo (JP); Hiroshi Miki, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 388 days.

(21) Appl. No.: 17/999,492

(22) PCT Filed: May 10, 2021

(86) PCT No.: PCT/JP2021/017752
§ 371 (c)(1),
(2) Date: Nov. 21, 2022

(87) PCT Pub. No.: WO2021/256117
PCT Pub. Date: Dec. 23, 2021

(65) Prior Publication Data
US 2023/0268433 A1    Aug. 24, 2023

(30) Foreign Application Priority Data
Jun. 16, 2020  (JP) .................................. 2020-103542

(51) Int. Cl.
*H10D 30/66*   (2025.01)
*H10D 30/65*   (2025.01)
(Continued)

(52) U.S. Cl.
CPC ......... *H10D 30/668* (2025.01); *H10D 30/658* (2025.01); *H10D 62/154* (2025.01);
(Continued)

(58) Field of Classification Search
CPC ...... H10D 30/64; H10D 30/66; H10D 30/668; H10D 30/65; H10D 30/658; H10D 62/152;
(Continued)

(56) References Cited

U.S. PATENT DOCUMENTS

| 2007/0158700 A1 | 7/2007 | Koh et al. |
| 2011/0079844 A1 * | 4/2011 | Hsieh ................... H10D 84/038 |
| | | 257/334 |
| 2017/0365665 A1 | 12/2017 | Hoshi et al. |

FOREIGN PATENT DOCUMENTS

| CN | 101488458 A * | 7/2009 | ......... H01L 29/0696 |
| JP | 2019-091754 A | 6/2019 | |

(Continued)

OTHER PUBLICATIONS

International Search Report, mailed Jul. 27, 2021, for International Application No. PCT/JP2021/017752.

*Primary Examiner* — John P. Dulka
(74) *Attorney, Agent, or Firm* — Baker Botts L.L.P.

(57) ABSTRACT

In the present invention, in a FinFET having a channel forming region on a surface of a fin that is a semiconductor layer protruding on an upper surface of a substrate, a channel at a corner of the fin is prevented from becoming an ON state with a low voltage and a steep ON/OFF operation is made possible. As a means thereof, in a MOSFET that has a plurality of trenches, each of which have embedded therein a gate electrode, on an upper surface of an n-type epitaxial substrate provided with a drain region on a bottom surface and that has a channel region formed on a surface of a fin which is a protrusion part between the trenches adjacent to (Continued)

each other, a p-type body layer that constitutes a lateral surface of the fin, and a $p^+$-type semiconductor region that constitutes a corner which is an end of the upper surface of the fin, are formed.

14 Claims, 12 Drawing Sheets

(51) Int. Cl.
*H10D 62/13* (2025.01)
*H10D 62/832* (2025.01)

(52) U.S. Cl.
CPC ......... *H10D 62/157* (2025.01); *H10D 62/158* (2025.01); *H10D 62/8325* (2025.01)

(58) Field of Classification Search
CPC .. H10D 62/154; H10D 62/155; H10D 62/156; H10D 62/157; H10D 62/158; H10D 62/159; H10D 30/662
See application file for complete search history.

(56) References Cited

FOREIGN PATENT DOCUMENTS

| | | |
|---|---|---|
| WO | WO 2005/074036 A1 | 8/2005 |
| WO | WO 2017/047286 A1 | 3/2017 |
| WO | WO 2020/100534 A1 | 5/2020 |

\* cited by examiner

TRENCHED GATE DOUBLE DIFFUSED SEMICONDUCTOR DEVICE WITH CHANNEL IMPURITY CONCENTRATION ADJUSTMENT REGION

TECHNICAL FIELD

The present invention relates to a semiconductor device, particularly to one having a trench structure.

BACKGROUND ART

In recent years, as a metal oxide semiconductor field effect transistor (MOSFET) in which an effective channel width (gate width) can be increased, a FinFET in which a channel is formed on a surface of a plate-shaped fin protruding on a substrate has been studied. For example, in a FinFET on a SiC substrate, an effective channel width can be increased by using, as a channel, a (11-20) plane or a (1-100) plane having high mobility, which is a side surface of a trench formed on an upper surface of a substrate of a (0001) plane. By the above, since channel parasitic resistance can be reduced, on-resistance of a MOSFET can be reduced.

PTL 1 (WO 2005/074036 A) discloses a FinFET having a semiconductor layer protruding from a base plane as a channel formation region. Here, formation of a parasitic transistor in a corner portion of a semiconductor layer upper portion is described to be suppressed by forming, in the semiconductor layer upper portion in the channel formation region, a channel impurity concentration adjustment region having impurity concentration higher than that of a portion below the semiconductor layer upper portion.

CITATION LIST

Patent Literature

PTL 1: WO 2005/074036 A

SUMMARY OF INVENTION

Technical Problem

However, in a FinFET, it is conceivable that an electric field concentrates at a corner portion of a fin upper portion, and a parasitic channel that is ON before a normal channel of a side surface of the fin is generated at the corner portion. As a result, a MOSFET becomes a device in which a threshold varies, and becomes a low performance device in which ON/OFF is gentle.

An object of the present invention is to improve performance of a semiconductor device. In particular, a FinFET capable of preventing a channel at a corner portion of a fin from become in an ON state at low voltage and performing steep ON/OFF operation is realized.

The foregoing and other objects and novel features of the present invention will be clarified from description of the present description and the accompanying drawings.

Solution to Problem

An outline of a representative embodiment disclosed in the present application will be briefly described below.

A semiconductor device which is an embodiment includes a semiconductor substrate of a first conductivity type, a plurality of trenches formed on an upper surface of the semiconductor substrate and arranged in a first direction, a protruding portion protruding upward from a bottom surface of the trench between two of the trenches adjacent to each other in the first direction, a first semiconductor region of a second conductivity type different from the first conductivity type, the first semiconductor region being formed in the protruding portion including a side surface of the protruding portion in the first direction, a second semiconductor region of the second conductivity type that is formed at a corner portion which is an upper end of the side surface of the protruding portion and has impurity concentration twice or more impurity concentration of the first semiconductor region, a third semiconductor region of the first conductivity type connected to one end portion of the protruding portion in a second direction intersecting the first direction in plan view, a fourth semiconductor region of the first conductivity type connected to another end portion of the protruding portion in the second direction, and a gate electrode embedded inside each of a plurality of the trenches with a gate insulating film interposed therebetween. The gate electrode, the first semiconductor region, the third semiconductor region, and the fourth semiconductor region constitute a field effect transistor.

Advantageous Effects of Invention

An effect obtained by a representative one of the inventions disclosed in the present application will be briefly described below.

According to the present invention, performance of a semiconductor device can be improved. In particular, it is possible to realize a FinFET that is capable of preventing a channel at a corner portion of a fin from being in an ON state at low voltage and allows steep ON/OFF operation.

DESCRIPTION OF EMBODIMENTS

Figure 1:
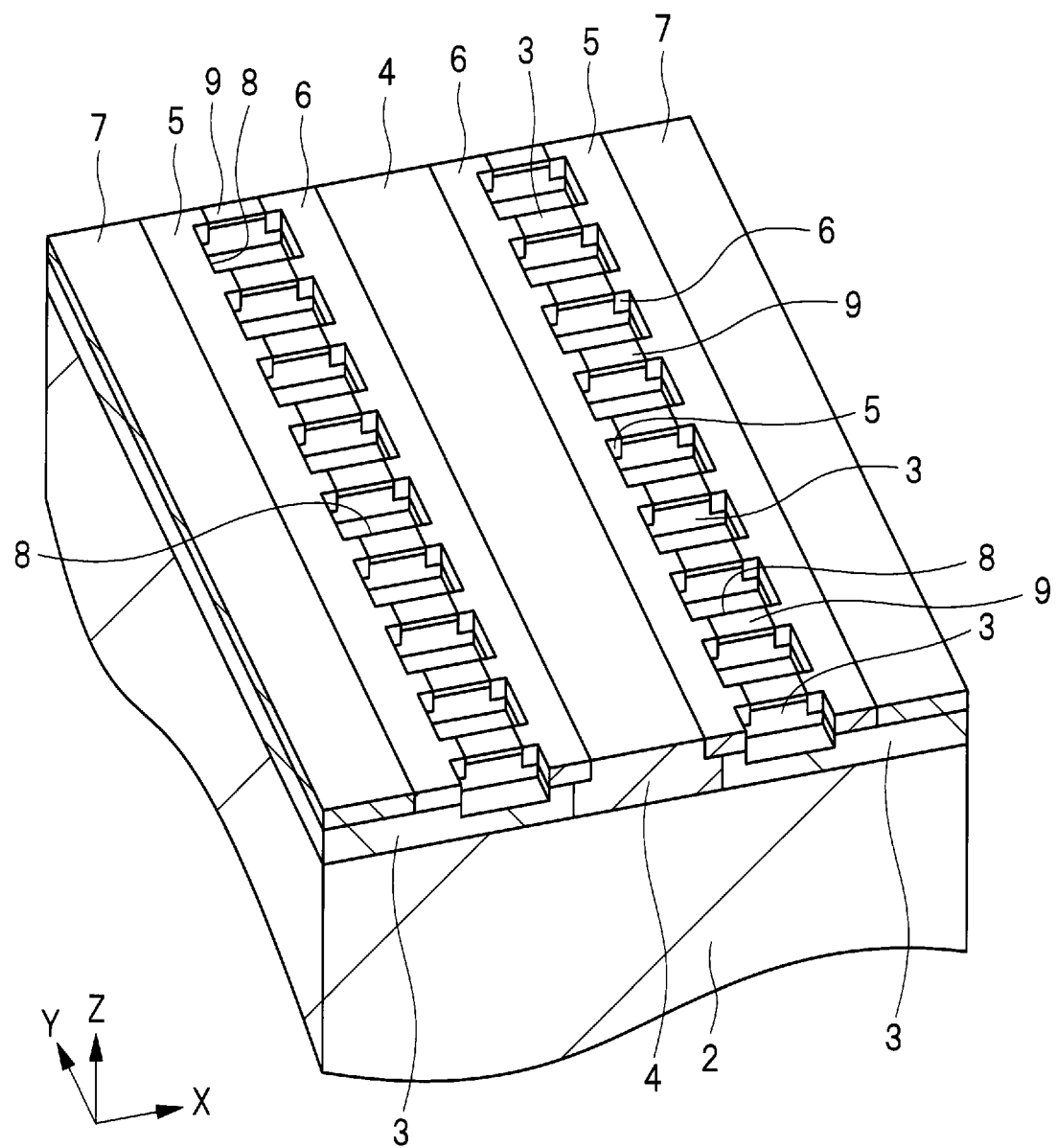
FIG. 1 is a bird's-eye view illustrating a semiconductor device according to an embodiment.

Hereinafter, an embodiment of the present invention will be described in detail with reference to the drawings. Note that, in all the drawings for describing an embodiment, members having the same function are denoted by the same reference numerals in principle, and repeated description of such members will be omitted. Further, in an embodiment below, description of the same or similar parts will not be repeated in principle unless otherwise necessary. Further, in the drawings describing an embodiment, hatching may be applied even in a plan view, a perspective view, or the like for easy understanding of a configuration. Furthermore, in the drawings describing an embodiment, hatching may be omitted in a cross-sectional view for easy understanding of a configuration.

Further, "−" and "+" are signs indicating relative impurity concentration of conductivity types of n type or p type, and for example, impurity concentration of an n type impurity is higher in the order of "$n^{--}$", "$n^{-}$", "$n$", "$n^{+}$", and "$n^{++}$".

Technical Problem

Figure 15:
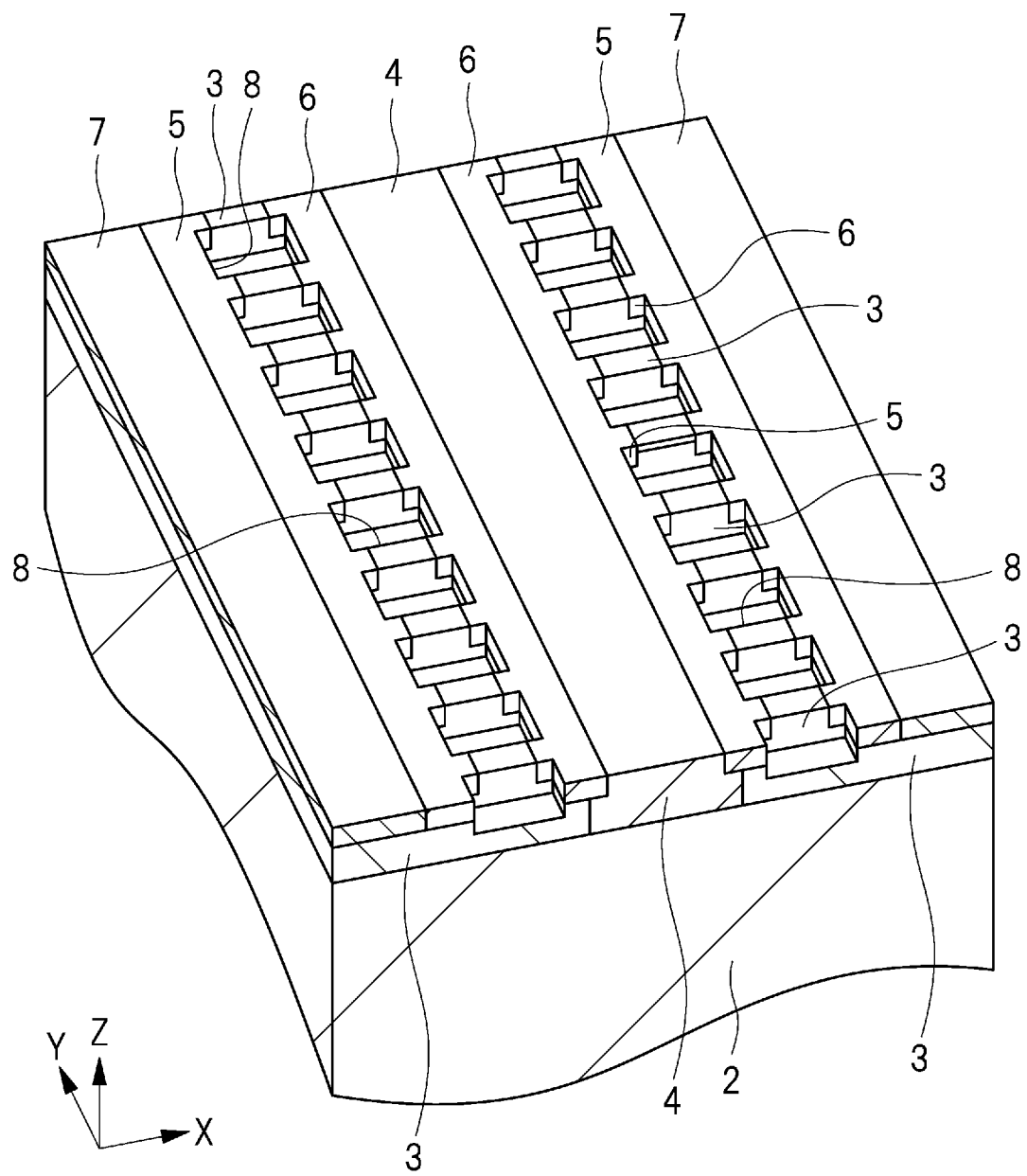
FIG. 15 is a bird's-eye view illustrating a semiconductor device as a comparative example.
Figure 16:
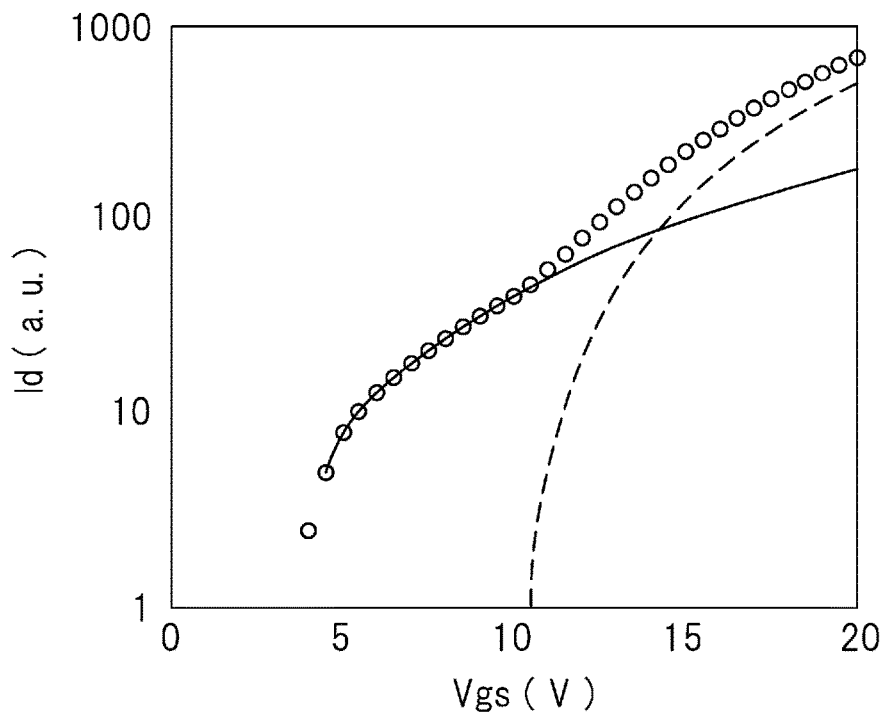
FIG. 16 is a graph illustrating a relationship between voltage and current in the semiconductor device as the comparative example.

Hereinafter, details of room for improvement will be described with reference to FIGS. 15 and 16. FIG. 15 is a bird's-eye view illustrating a semiconductor device of a comparative example. FIG. 16 is a graph illustrating a relationship between voltage and current in the semiconductor device of the comparative example. In FIG. 15, illustration of a structure on an epitaxial layer, that is, a gate insulating film, a gate electrode, an interlayer insulating film, a source plug, and the like is omitted.

FIG. 15 illustrates a SiC power metal oxide semiconductor field effect transistor (MOSFET) which is a trench type double diffused metal oxide semiconductor (DMOS) of the comparative example. Hereinafter, this element may be simply referred to as a MOSFET or a FinFET. Note that, although a lateral MOSFET to be described later in a fourth variation is not a DMOS, a DMOS and a lateral MOSFET are collectively referred to as a MOSFET here.

As illustrated in FIG. 15, in the comparative example, an n type epitaxial layer (semiconductor layer) 2 made from SiC having impurity concentration lower than that of an $n^{+}$ type SiC substrate is formed on an upper surface of an $n^{+}$ type SiC substrate (not illustrated) made from SiC (silicon carbide). The epitaxial layer 2 functions as a drift layer. Thickness of the epitaxial layer 2 is, for example, about 5 to 50 μm.

A p type body layer (well region) 3 is formed in the epitaxial layer 2 with a predetermined depth from an upper surface of the epitaxial layer 2, and the body layer 3 is electrically connected to a source electrode (not illustrated) via a $p^{++}$ type body layer contact region 7 formed from an upper surface of the body layer 3 to a middle depth of the body layer 3.

In the epitaxial layer 2, a JFET region 4 is formed with a predetermined depth from an upper surface of the epitaxial layer 2. The body layer 3, the JFET region 4, and the body layer contact region 7 all extend in a Y direction. On an upper surface of the body layer 3 between the JFET region 4 and the body layer contact region 7, a plurality of trenches 8 are formed side by side in the Y direction. The trench 8 is formed up to a middle depth of the body layer 3, and a plate-like protruding portion (semiconductor layer) formed between the trenches 8 adjacent to each other in the Y direction and extending in an X direction is hereinafter referred to as a fin. The body layer 3 is formed from an upper surface to a lower surface of a fin. An $n^{+}$ type current spreading region 6 is formed between the body layer 3 and the JFET region 4 in a fin. Further, an $n^{++}$ type source region 5 is formed between the body layer 3 and the body layer contact region 7 in a fin, and the source region 5 is electrically connected to a source electrode.

In the trench 8, a gate electrode (not illustrated) is formed via a gate insulating film (not illustrated). A MOSFET includes at least a fin including a channel formation region, the source region 5, a drain region (SiC substrate), and a gate electrode in the trench 8.

When the gate electrode is in an ON state, electrons flowing through the MOSFET pass from the $n^{++}$ type source region 5 through a channel formed on the p type body layer 3 on a side surface (side surface of the fin) of the trench 8 adjacent to the gate electrode. After the above, the electrons sequentially move to the n type JFET region 4, the n type epitaxial layer 2, an n+ type SiC substrate as the drain region, and a drain wiring electrode (not illustrated) in a bottom portion of the SiC substrate.

In a FinFET in which a channel is formed in a fin like the MOSFET of the comparative example, an electric field tends to concentrate at a corner portion of a trench, that is, an upper end of a side surface of the fin. Due to this electric field concentration, a channel is easily formed at a corner portion of the fin as compared with the side surface of the fin. A corner portion of a fin or a corner portion of a trench referred to in the present application refers to not a corner portion of a lower end of the fin or a trench but a corner portion of an upper end.

FIG. 16 illustrates a graph in which the horizontal axis represents gate-source voltage (gate voltage) and the vertical axis represents drain current. In FIG. 16, a graph of current on a side surface of a fin is indicated by a broken line, a graph of current at a corner portion of a fin is indicated by a solid line, and a graph of current as the sum of these currents is indicated by a round plot. As illustrated in FIG. 16, since current starts to flow at gate voltage lower by about 8 V at a corner portion of a fin than a side surface of the fin, in an entire MOSFET, the current gradually rises at the time of ON.

That is, in the MOSFET of the comparative example, since a parasitic channel at a corner portion of a fin becomes in an ON state at lower voltage than a side surface of the fin in which a normal channel is formed, the MOSFET becomes a device in which threshold voltage varies, and becomes a low-performance device in which ON/OFF is gentle.

As described above, in a semiconductor device including a FinFET, preventing a channel at a corner portion of a fin from becoming in an ON state at low voltage exists as room for improvement.

In view of the above, in an embodiment of the present application, contrivance is made to solve the above-described room for improvement. Hereinafter, a technical idea in an embodiment to which this contrivance is applied will be described.

EMBODIMENT

Hereinafter, a semiconductor device will be described with reference to the drawings by exemplifying a SiC power MOSFET having a side surface in a trench (groove, or a recessed portion) as a channel region, that is, a trench-type DMOS.

<Structure of Semiconductor Device>

Figure 2:
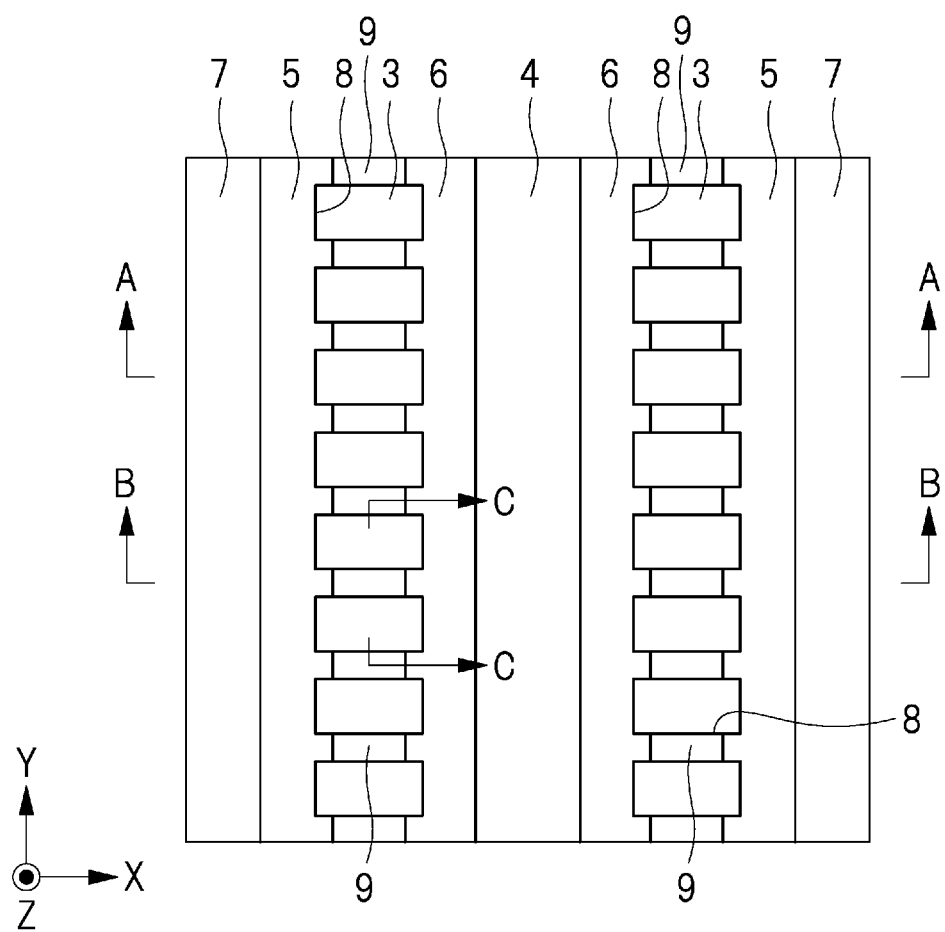
FIG. 2 is a plan view illustrating the semiconductor device according to the embodiment.
Figure 3:
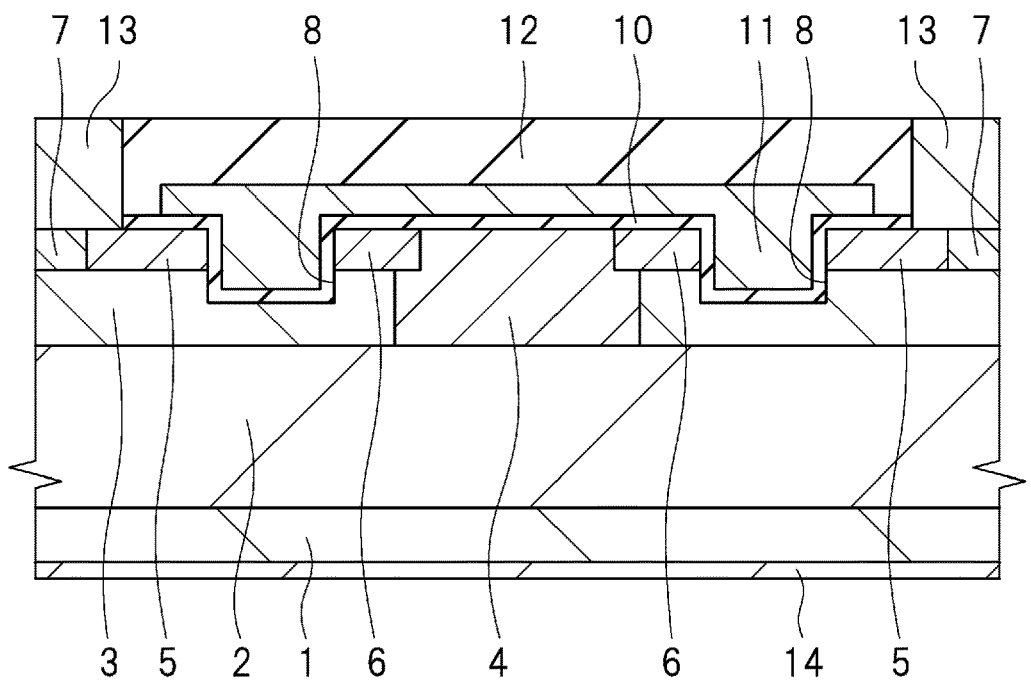
FIG. 3 is a cross-sectional view taken along line A-A in FIG. 2.
Figure 4:
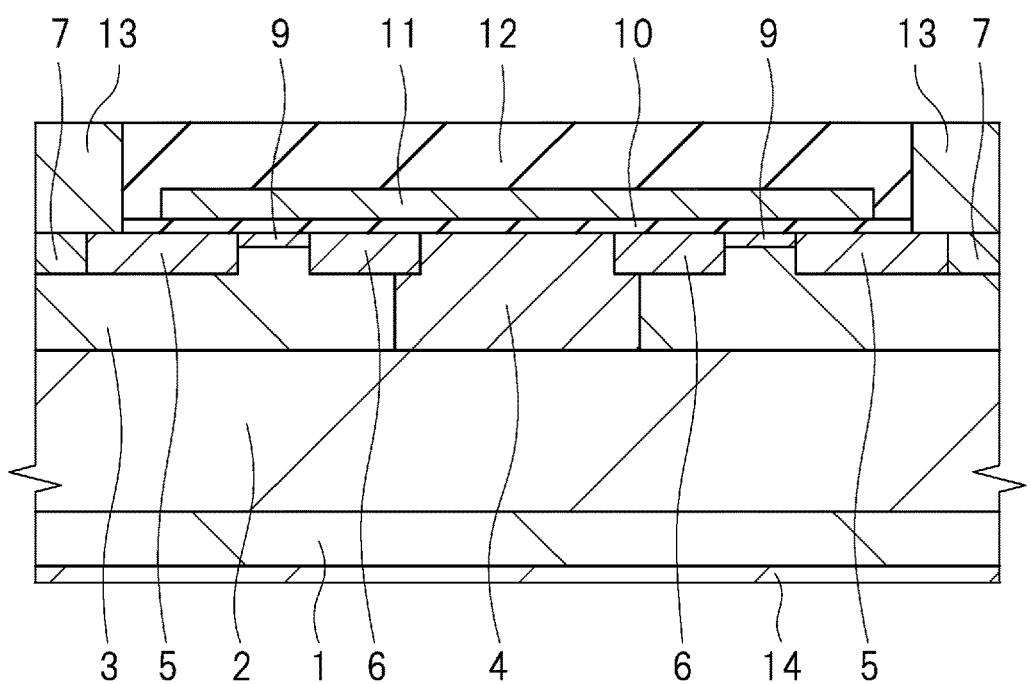
FIG. 4 is a cross-sectional view taken along line B-B in FIG. 2.

A structure of a MOSFET which is a semiconductor device according to the present embodiment will be described with reference to FIGS. 1 to 4. FIG. 1 is a bird's-eye view illustrating the semiconductor device according to the present embodiment. FIG. 2 is a plan view illustrating the semiconductor device according to the present embodiment. FIGS. 3 and 4 are cross-sectional views illustrating the semiconductor device of the present embodiment. FIG. 3 is a cross-sectional view taken along line A-A in FIG. 2, and is a cross-sectional view including a trench and a gate electrode in the trench. FIG. 4 is a cross-sectional view taken along line B-B in FIG. 2, and is a cross-sectional view of a portion not including a trench. In FIG. 1, illustration of a structure on an epitaxial layer, that is, a gate insulating film, a gate electrode, an interlayer insulating film, a source plug, and the like illustrated in FIG. 3 is omitted.

XYZ coordinate axes used in description are defined by directions shown in the drawings. In the present application, the Z direction (Z-axis direction) is a direction perpendicular to a (0001) plane among crystal planes of a SiC substrate, and the X direction (X-axis direction) and the Y direction (Y-axis direction) are directions perpendicular to a (11-20) plane or a (1-100) plane. Each of the X direction and the Y direction is a direction along an upper surface (main surface) of a SiC epitaxial substrate, and the Z direction is a thickness direction (height direction or depth direction) of the SiC epitaxial substrate. The X direction, the Y direction, and the Z direction are orthogonal to each other. That is, the X direction and the Y direction intersect each other in plan view.

As illustrated in FIGS. 3 and 4, the semiconductor device according to the present embodiment includes an n type silicon carbide (SiC) epitaxial substrate (hereinafter, referred to as a SiC epitaxial substrate.). The SiC epitaxial substrate includes the $n^+$ type SiC substrate 1 and the n type epitaxial layer (semiconductor layer) 2 formed on the $n^+$ type SiC substrate 1. The epitaxial layer 2 functions as a drift layer. Thickness of the epitaxial layer 2 is, for example, about 5 to 50 μm.

As illustrated in FIGS. 1 to 4, the body layer (well region) 3 which is a p type semiconductor region is formed in the epitaxial layer 2 with a predetermined depth from an upper surface of the epitaxial layer 2. The body layer contact region 7 which is a $p^{++}$ type semiconductor region, the source region 5 which is an $n^{++}$ type semiconductor region containing nitrogen (N) as an impurity, and the current spreading region 6 which is an $n^+$ type semiconductor region containing nitrogen (N) as an impurity are formed in the body layer 3 with a predetermined depth from an upper surface of the epitaxial layer 2 (upper surface of the body layer 3). Further, the trench 8 is formed from an upper surface of the body layer 3 to a middle depth of the body layer 3.

The body layer 3, the source region 5, the current spreading region 6, and the body layer contact region 7 extend in the Y direction and are formed from an upper surface of the body layer 3 to an intermediate depth of the body layer 3. A plurality of the trenches 8 are formed side by side in the Y direction. A shape of each of a plurality of the trenches 8 in plan view is, for example, a rectangle extending in the X direction. All the trenches 8 are formed between the source region 5 and the current spreading region 6 adjacent to each other in the X direction such that a channel is formed on the (11-20) plane or the (1-100) plane which is a side surface along the X direction.

The body layer contact region 7 and the source region 5 are electrically connected to a source wiring electrode (not illustrated) formed on the epitaxial layer 2 via a source plug (source conductive connection portion or source electrode) 13. That is, the body layer 3 is electrically connected to the source wiring electrode via the body layer contact region 7 and the source plug 13.

In the epitaxial layer 2 adjacent to the body layer 3 in plan view, the JFET region 4 is formed with a predetermined depth from an upper surface of the epitaxial layer 2. That is, the JFET region 4 is in contact with the epitaxial layer 2. The JFET region 4 is an n type semiconductor region arranged between the body layers 3 adjacent to each other in the X direction and extending in the Y direction. That is, the source region, the trench 8, the current spreading region 6, and the JFET region 4 are arranged in this order in the X direction. N type impurity concentration of the JFET region 4 may be the same as n type impurity concentration of the epitaxial layer 2, but may be higher than the n type impurity concentration of the epitaxial layer 2. The n type impurity concentration of the JFET region 4 is lower than n type impurity concentration of the current spreading region 6.

In the X direction, the body layer contact region 7 is formed at the center (the left end or the right end in FIG. 3) of an upper surface of body layer 3. In the X direction, on an upper surface of the body layer 3, the source region 5, the trench 8, and the current spreading region 6 are arranged in this order from the body layer contact region 7 toward each of the JFET regions 4 adjacent to both sides of the body layer 3. Note that, of end portions of the current spreading region 6, an end portion on the opposite side to the source region 5 does not overlap the body layer 3 in plan view, and is formed in the epitaxial layer 2 adjacent to the body layer 3. Here, the end portion of the current spreading region 6 overlaps the JFET region 4 in plan view. Further, the JFET region 4 and the body layer 3 have substantially the same depth. The body layer contact region 7 and the source region 5 are in contact with each other. The source region 5 and the body layer 3 are in contact with each other, and the current spreading region 6 and the body layer 3 are in contact with each other. The current spreading region 6 and the JFET region 4 are in contact with each other.

A plate-like protruding portion (semiconductor layer) protruding upward from a bottom surface of the trench 8 between the trenches 8 adjacent to each other in the Y direction is referred to as a fin here. A fin extends in the X direction. The body layer 3 is mainly formed in a fin, and a $p^+$ type semiconductor region (high-concentration layer or electric field relaxation layer) 9 is formed on an upper surface of a fin. The semiconductor region 9 is formed from an upper surface (upper surface of the epitaxial layer 2 or upper surface of the body layer 3) of a fin to a middle depth of the fin. That is, under the semiconductor region 9, the body layer 3 is formed from a side surface of a fin to the inside of the fin.

Each of the source region 5, the current spreading region 6, and the semiconductor region 9 is formed to be shallower than a depth of the trench 8, and the semiconductor region 9 is formed to be shallower than both the source region 5 and the current spreading region 6. The semiconductor region 9 is formed at least at an end portion in the Y direction of an upper surface of a fin, that is, at a corner portion. In other words, the semiconductor region 9 is formed at a corner portion which is an upper end of a side surface of a fin. That is, the semiconductor region 9 is a p type high-concentration layer provided to relax an electric field at a corner portion of a fin, but here, the semiconductor region 9 is formed between corner portions at both ends of a fin in the Y direction. The semiconductor region 9 is formed at an upper end of a side surface of a fin.

Here, a boundary portion between a side surface and an upper surface of a fin is referred to as a corner portion on the assumption that the fin has a cross-sectional shape such as a rectangular shape or a trapezoidal shape, but it is conceivable that a corner portion of the fin is rounded. Even in this case, in the present application, the boundary between a side surface and an upper surface of a fin is referred to as a corner portion.

One end portion of a fin in the X direction is connected to the source region 5, and the other end portion of the fin in the X direction is connected to the current spreading region 6. That is, in the X direction, a fin and the trench 8, and the source region 5 and the current spreading region 6 are not separated from each other but are in contact with each other. A part of each of the source region 5 and the current spreading region 6 may be formed in a fin. At this time, the source region 5 and the body layer 3 are in contact with each other on a side surface extending in the X direction among side surfaces of the trench 8. Further, the current spreading region 6 and the body layer 3 are in contact with each other on a side surface extending in the X direction among side surfaces of the trench 8.

Among side surfaces of the trench 8, the source region 5 is in contact with one of two side surfaces facing each other in the X direction, the current spreading region 6 is in contact with the other side surface, and the body layer 3 and the semiconductor region 9 between the source region 5 and the current spreading region 6 are in contact with the other side surfaces (side surfaces facing each other in the Y direction). The trench 8 is formed to be deeper than both the source region 5 and the current spreading region 6, and is formed shallower than the body layer 3. For this reason, a bottom surface of the trench 8 is in contact with the p type body layer 3 and does not reach the epitaxial layer 2 under the body layer 3.

As illustrated in FIG. 3, a gate electrode 11 is formed on the epitaxial layer 2 including the inside of the trench 8 with a gate insulating film 10 interposed between them. That is, the gate electrode 11 is embedded inside the trench 8 with the gate insulating film 10 interposed between them. The gate electrode 11 is also formed on each of a fin, the source region 5, and the current spreading region 6 with the gate insulating film 10 interposed between them.

An interlayer insulating film 12 including, for example, a silicon oxide film is formed on each of the epitaxial layer 2, the gate insulating film 10, and the gate electrode 11. A laminated film including the gate insulating film 10 and the interlayer insulating film 12 has a through hole at a position separated from the gate electrode 11, and the source plug 13 as a conductive connection portion is formed in the through hole. The source plug 13 is electrically connected to the body layer contact region 7 and the source region 5. The source plug 13, the body layer contact region 7, and the source region 5 may be directly connected to each other, or may be connected to each other via another metal film or silicide layer. The source plug 13 is electrically connected to a source wiring electrode. Further, the gate electrode 11 is electrically connected to a gate wiring electrode (not illustrated) via a gate plug penetrating the interlayer insulating film 12 on the gate electrode 11. A back surface (bottom surface) of the SiC substrate 1 is covered with a drain wiring electrode (drain electrode) 14. That is, the SiC substrate 1 constitutes a drain region, and the drain wiring electrode 14 is electrically connected to the SiC substrate 1.

A MOSFET (MOS field effect transistor) of the present embodiment includes at least the source region 5, a fin, a drain region (SiC substrate 1), and the gate electrode 11. Further, the MOSFET includes the current spreading region 6 which is an n type layer electrically connected to a drain electrode (drain wiring electrode 14), the JFET region 4, and the epitaxial layer 2. That is, the current spreading region 6 is electrically connected to the drain region formed on a bottom surface of an epitaxial substrate via the JFET region 4 and the epitaxial layer 2. Further, the MOSFET includes, as a channel formation region, the body layer 3 constituting a side surface of a fin, and the semiconductor region 9 constituting a corner portion and an upper surface of the fin.

When the gate electrode 11 is in an ON state, electrons flowing through a SiC power MOSFET mainly pass through the p type body layer 3 on a side surface of the trench 8, which is a channel region adjacent to the gate electrode 11, from the $n^{++}$ type source region 5. After the above, electrons move to the n type JFET region 4, the n type epitaxial layer 2, an $n^+$ type SiC substrate as a drain region, and the drain wiring electrode 14 below the SiC substrate in this order. The gate insulating film 10 is made from, for example, a silicon oxide film, and the gate electrode 11 is made from, for example, a polysilicon film (conductor film).

In a FinFET having a fin as a channel formation region, not only an upper surface of an epitaxial substrate but also a side surface of a fin can be used as a channel. Therefore, it is possible to realize a high-performance semiconductor device that secures a large gate width while suppressing an area of a semiconductor element in plan view.

The current spreading region 6 has a role of preventing current from concentrating and flowing in a partial region due to the fact that electrons that pass through the body layer 3 flow downward in the JFET region 4 and travel toward the SiC substrate 1 side at a shortest distance. That is, since the current spreading region 6 having relatively high impurity concentration is formed, electrons passing through the body layer 3 diffuse in the current spreading region 6, and uniformly flow inside an n type semiconductor region including inside the current spreading region 6 and inside the JFET region 4.

A preferable range of impurity concentration of the $n^+$ type SiC substrate 1 is, for example, $1 \times 10^{18}$ to $1 \times 10^{21}$ cm$^{-3}$. A preferable range of impurity concentration of the n type epitaxial layer 2 is, for example, $1 \times 10^{14}$ to $1 \times 10^{17}$ cm$^{-3}$. A preferable range of impurity concentration of the p type body layer 3 is, for example, $1 \times 10^{16}$ to $5 \times 10^{17}$. A preferable range of impurity concentration of the $n^{++}$ type source region 5 is, for example, $1 \times 10^{19}$ to $1 \times 10^{21}$ cm$^{-3}$. A preferable range of impurity concentration of the $n^+$ type current spreading region 6 is, for example, $5\times10^{16}$ to $5\times10^{18}$ cm$^{-3}$. A preferable range of impurity concentration of the n type JFET region 4 is, for example, $1\times10^{15}$ to $1\times10^{18}$ cm$^{-3}$. A preferable range of impurity concentration of the p$^{++}$ type body layer contact region 7 is, for example, a range of $1\times10^{19}$ to $1\times10^{21}$ cm$^{-3}$.

Figure 5:
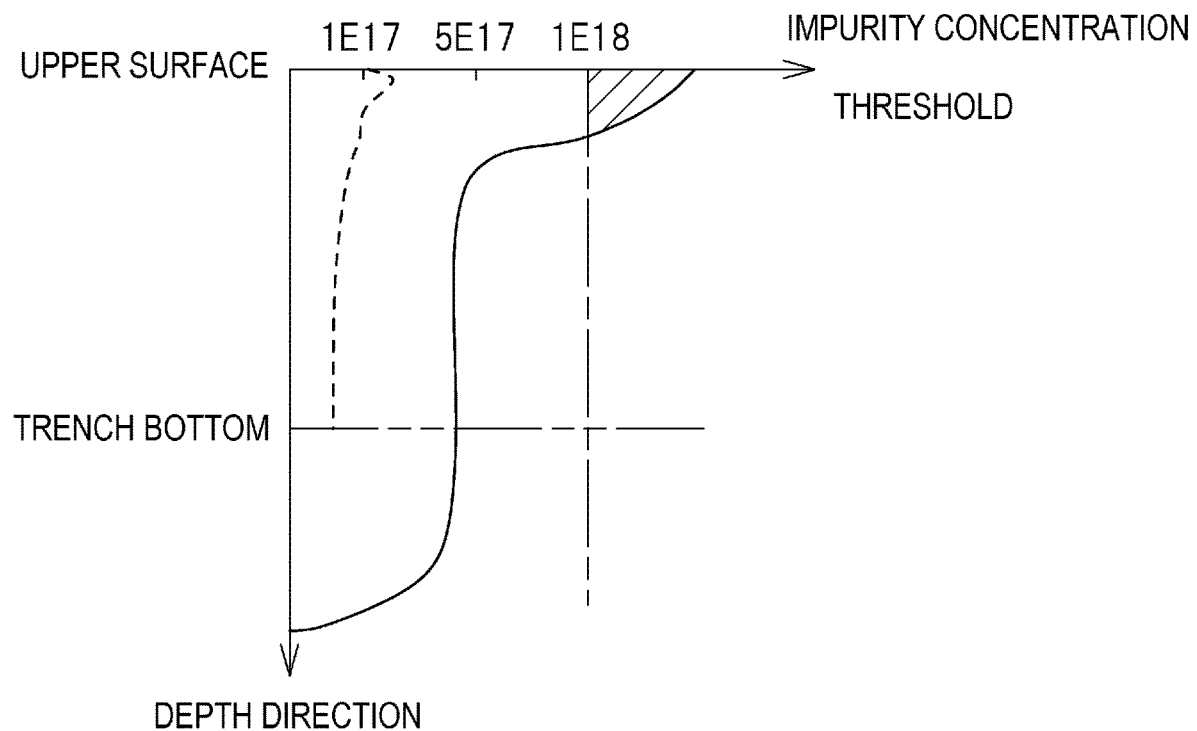
FIG. 5 is a graph illustrating a relationship between impurity concentration, threshold voltage, and a depth of a fin constituting the semiconductor device according to the embodiment.

FIG. 5 is a graph illustrating a relationship between impurity concentration, threshold voltage, and a depth of a fin constituting the MOSFET of the present embodiment. In the graph illustrated in FIG. 5, the vertical axis represents a depth, and the horizontal axis represents impurity concentration and threshold voltage. The depth here is a distance in a direction from an upper surface of a fin toward a SiC substrate, and is a distance in a negative direction in the Z direction. An upper end of the vertical axis in FIG. 5 corresponds to an upper surface of a fin, and a depth becomes larger from the upper end toward the lower side. In FIG. 5, a position (depth) of a trench bottom is indicated by a two-dot chain line. Further, in FIG. 5, a one-dot chain line is indicated at a position where impurity concentration is $1\times10^{18}$ cm$^{-3}$. In FIG. 5, a region having impurity concentration of $1\times10^{18}$ cm$^{-3}$ or more is hatched.

As illustrated in FIG. 5, the inside of a fin has high impurity concentration in the vicinity of an upper end, and has low impurity concentration in a region below the vicinity of the upper end. Specifically, impurity concentration of the semiconductor region 9 (see FIG. 3) formed in an upper portion in a fin is $1\times10^{18}$ to $1\times10^{19}$ cm$^{-3}$. Further, an average value of impurity concentration on a side surface of a fin below the semiconductor region 9 (side surface of the trench 8) is less than $5\times10^{17}$ cm$^{-3}$. That is, impurity concentration of the semiconductor region 9 is twice or more impurity concentration of the body layer 3 on a side surface of a trench.

Impurity concentration in the semiconductor region 9 is not uniform, and gradually decreases from the upper end side of a fin toward a depth direction. That is, impurity concentration of a side surface of the semiconductor region 9 is highest at a corner portion (upper end).

Figure 6:
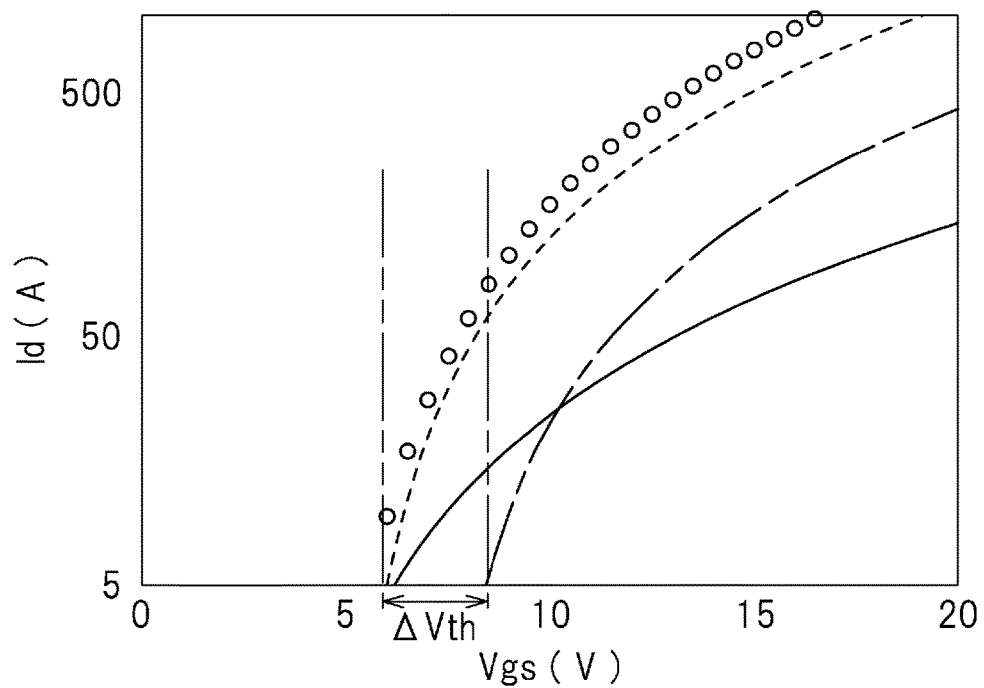
FIG. 6 is a graph illustrating a relationship between voltage and current in each portion of the fin constituting the semiconductor device according to the embodiment.

FIG. 6 is a graph illustrating a relationship between voltage and current in each portion of a fin constituting the MOSFET of the present embodiment. In the graph of FIG. 6, the vertical axis represents drain current, and the horizontal axis represents gate-source voltage. In FIG. 6, a graph of current flowing through a side surface excluding a corner portion of a fin is indicated by a broken line, and a graph of current flowing through the corner portion is indicated by a solid line. Further, a graph of current flowing through an upper surface of a fin excluding a corner portion is indicated by a one-dot chain line, and current flowing through the entire fin is indicated by a round plot.

As illustrated in FIG. 6, current starts to flow at lower voltage on a side surface and a corner portion of a fin than on an upper surface of the fin. That is, threshold voltage of each of a side surface and a corner portion of a fin is low. Here, by forming the semiconductor region 9, threshold voltage of a corner portion of a fin is increased, so that a range ΔVth of threshold voltage of each of a corner portion, a side surface, and an upper surface of the fin is suppressed to less than 5 V.

Figure 7:
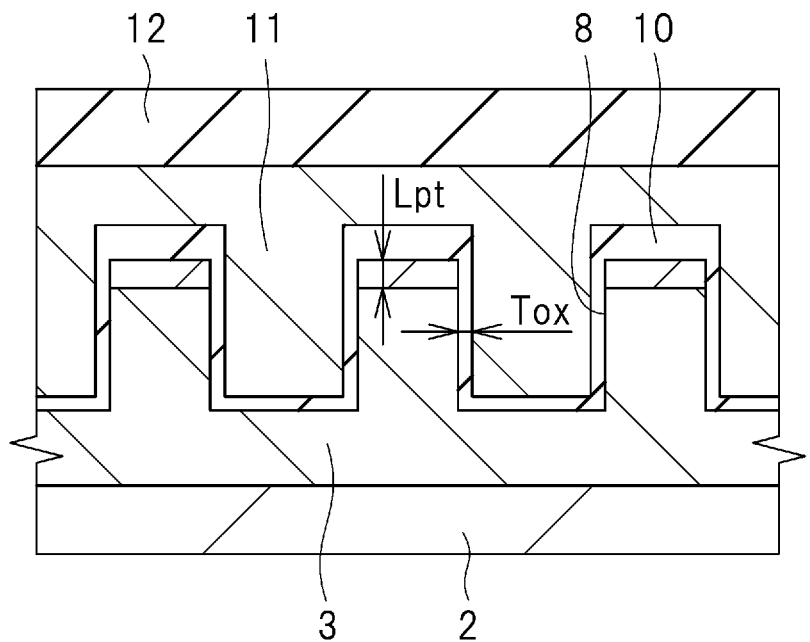
FIG. 7 is a cross-sectional view taken along line C-C in FIG. 2.

Next, FIG. 7 illustrates a cross-sectional view taken along line C-C in FIG. 2. FIG. 7 is a cross-sectional view illustrating a plurality of fins arranged in the Y direction and a plurality of trenches arranged in the Y direction in the MOSFET of the present embodiment. Note that, in FIG. 7, illustration of a SiC substrate and a drain wiring electrode under the epitaxial layer 2 is omitted.

As illustrated in FIG. 7, the fins and the trenches 8 are alternately arranged in the Y direction. Further, the gate electrode 11 is embedded inside each of a plurality of the trenches 8. Here, the gate insulating film 10 is formed by a deposition method such as a chemical vapor deposition (CVD) method. For this reason, film thickness of the gate insulating film 10 on the epitaxial layer 2 (on a fin) between the trenches 8 adjacent to each other is larger than film thickness Tox of the gate insulating film 10 covering a side surface of the trench 8 (side surface of a fin).

Here, a depth Lpt of the semiconductor region 9 in the Z direction (depth direction or thickness direction) is larger than the film thickness Tox of the gate insulating film 10 covering a side surface of the trench 8 (side surface of a fin) and 200 nm or less.

<Effect of Present Embodiment>

Next, an effect of the MOSFET according to the present embodiment will be described.

In the present embodiment, unlike the comparative example illustrated in FIG. 15, the semiconductor region 9 having higher impurity concentration than the body layer 3 on a side surface of a fin is formed on an upper surface of the fin between the trenches 8 adjacent to each other. That is, impurity concentration at a corner portion of a fin of the present embodiment is higher than impurity concentration at a corner portion of a fin of the comparative example. By the above, in the present embodiment, threshold voltage at a corner portion of a fin can be increased, and a parasitic channel formed at the corner portion of a fin can be prevented from being turned ON at relatively low voltage.

Figure 8:
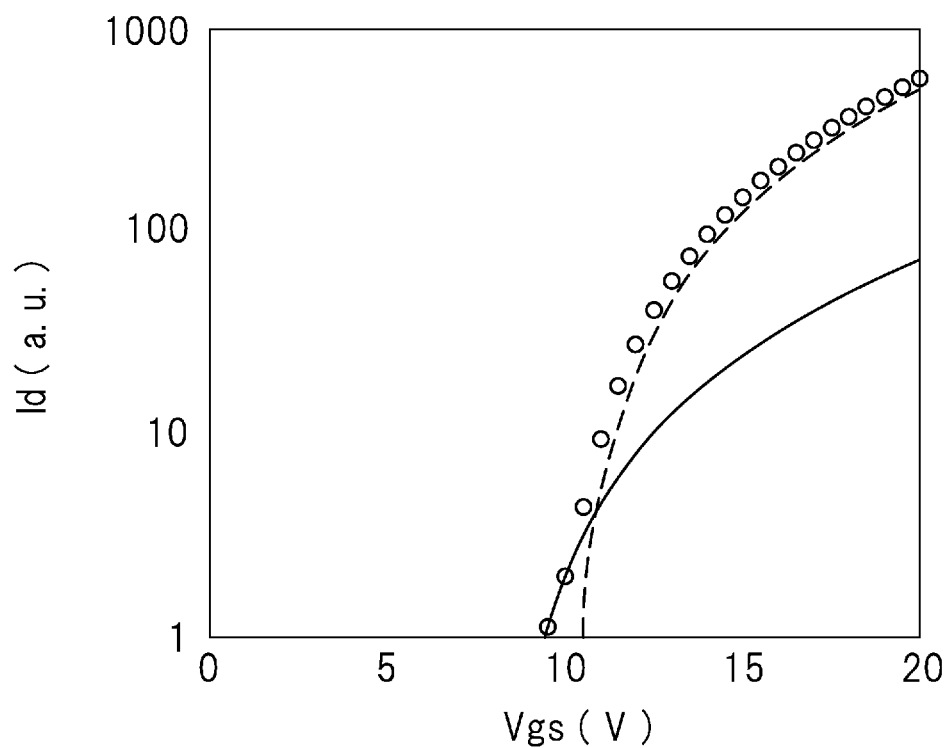
FIG. 8 is a graph illustrating a relationship between voltage and current in the semiconductor device according to the embodiment.

FIG. 8 is a graph in which the horizontal axis represents gate-source voltage (gate voltage) and the vertical axis represents drain current. In FIG. 8, a graph of current on a side surface of a fin is indicated by a broken line, a graph of current at a corner portion of a fin is indicated by a solid line, and a graph of current as the sum of these currents is indicated by a round plot. As can be seen by comparing FIG. 8 and FIG. 16, in the present embodiment, by forming the semiconductor region 9 at an upper end of a fin, electric field concentration at a corner portion of the fin is prevented, and threshold voltage at the corner portion of the fin is increased as compared with the comparative example. By the above, threshold voltage of a parasitic channel at the corner portion can be adjusted to the same threshold voltage as a normal channel on a side surface of the fin. Therefore, in the entire MOSFET, as compared with the comparative example, the rise of current at the time of ON can be made steep, and time required from when current starts flowing to when the current reaches a desired current value at the time of ON/OFF can be shortened. That is, performance of the semiconductor device can be improved.

Further, as illustrated in FIG. 5, here, impurity concentration of the semiconductor region 9 is twice or more impurity concentration of the body layer 3 on a side surface of a fin. When impurity concentration of the body layer 3 on a side surface of a fin is high, loss (for example, ON resistance) increases. In particular, in a SiC device in which an epitaxial substrate contains SiC, it is conceivable to set concentration of an impurity of the body layer 3 on a side surface of a fin to less than $5\times10^{17}$ cm$^{-3}$ at most. Therefore, here, by setting impurity concentration of the semiconductor region 9 to $1\times10^{18}$ cm$^3$, a parasitic channel is set to normally-off (threshold voltage is less than 0 V).

Further, as illustrated in FIG. 6, here, threshold voltage of a corner portion, a side surface, and an upper surface of a fin are within a range of 5 V. That is, a difference between a maximum value and a minimum value in threshold voltage at these portions is less than 5 V.

As the difference between these thresholds is smaller, various channel surfaces by the trench 8 can be effectively utilized. In practice, a range of threshold voltage of each of a corner portion, a side surface, and an upper surface of a fin is desirably controlled to a range of about 5 V. Note that a bottom surface of the trench 8 is not assumed to be used as a channel. This is because a channel on the bottom surface has poor gate controllability. Therefore, impurity concentration of the bottom surface is set to be relatively high, and, by this, threshold voltage should be extremely increased, and it is not necessary to include threshold voltage of the bottom surface within the range of 5 V.

Further, as illustrated in FIG. 7, here, the depth Lpt of the semiconductor region 9 is made larger than the film thickness Tox of the gate insulating film 10 covering a side surface of a fin. This is because in a case where the depth Lpt of the semiconductor region 9 is smaller than the film thickness Tox, there is a possibility that threshold voltage of a corner portion of a fin cannot be sufficiently increased. Further, since degree of electric field concentration increases as the film thickness Tox of the gate insulating film 10 increases, the depth Lpt of the semiconductor region 9 should be set in accordance with the film thickness Tox of the gate insulating film 10.

As the depth Lpt of the semiconductor region 9 is larger, occurrence of an adverse effect due to a parasitic channel can be prevented more. However, the depth Lpt of the semiconductor region 9 is 200 nm or less. If the depth Lpt of the semiconductor region 9 is too large, an area of a normal channel on a side surface of a fin decreases, and a gate width of the MOSFET decreases. Therefore, the depth Lpt of the semiconductor region 9 should be kept at a necessary and sufficient depth. Further, when the semiconductor region 9 has sufficient impurity concentration, a depletion layer is unlikely to extend by 200 nm or more. That is, when the semiconductor region 9 has a depth of 200 nm, two-dimensional band bending can be eliminated, and the semiconductor region 9 can be completely closed.

Figure 17:
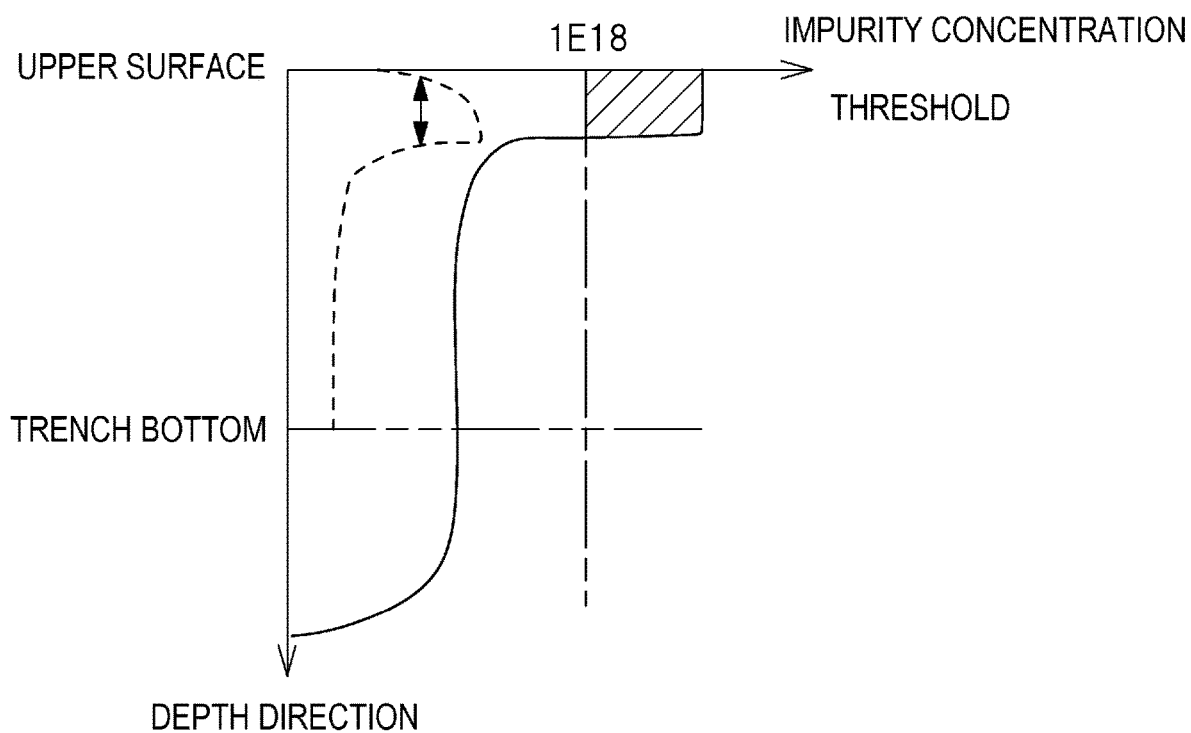
FIG. 17 is a graph illustrating a relationship between impurity concentration, threshold voltage, and a depth of a fin constituting the semiconductor device as the comparative example.

Further, as illustrated in FIG. 17 as a comparative example, it is conceivable to make concentration of the semiconductor region 9 constant at any depth. FIG. 17 is a graph illustrating a relationship between impurity concentration, threshold voltage, and a depth of a fin constituting a MOSFET of the comparative example. Similarly to FIG. 5, in the graph of FIG. 17, the vertical axis represents a depth, and the horizontal axis represents impurity concentration and threshold voltage. In FIG. 17, a depth of a trench bottom is indicated by a two-dot chain line. Further, in FIG. 17, a one-dot chain line is indicated at a position where impurity concentration is $1\times10^{18}$ $cm^{-3}$. In FIG. 17, a region having impurity concentration of $1\times10^{18}$ $cm^{-3}$ or more is hatched.

In this case, since an electric field concentrates at an upper end (corner portion) of a side surface of a fin, threshold voltage is suppressed to be moderately low. However, in the semiconductor region 9 having impurity concentration of $1\times10^{18}$ $cm^{-3}$ or more, a lower portion is a location where an electric field is not concentrated and has high impurity concentration, and thus threshold voltage is high as indicated by a broken line in FIG. 17. For this reason, at a depth in a range indicated by an arrow in FIG. 17, the MOSFET does not operate because threshold voltage is excessively high, and current hardly flows.

On the other hand, as illustrated in FIG. 5, the semiconductor region 9 of the present embodiment has a gradient profile in which impurity concentration monotonously decreases from an upper end of a side surface of a fin (upper surface of the epitaxial substrate) toward a lower end of the semiconductor region 9. In other words, impurity concentration of the semiconductor region 9 gradually decreases from an upper surface of a fin toward a lower surface of the semiconductor region 9. That is, impurity concentration of the semiconductor region 9 continuously decreases in a depth direction.

As described above, by setting impurity concentration of the semiconductor region 9 to be lower at a position farther in a downward direction from a corner portion of a fin, threshold voltage of the MOSFET can be made substantially constant as indicated by a broken line in FIG. 5. By the above, a surface of a fin can be effectively used as a channel.

<First Variation>

Figure 9:
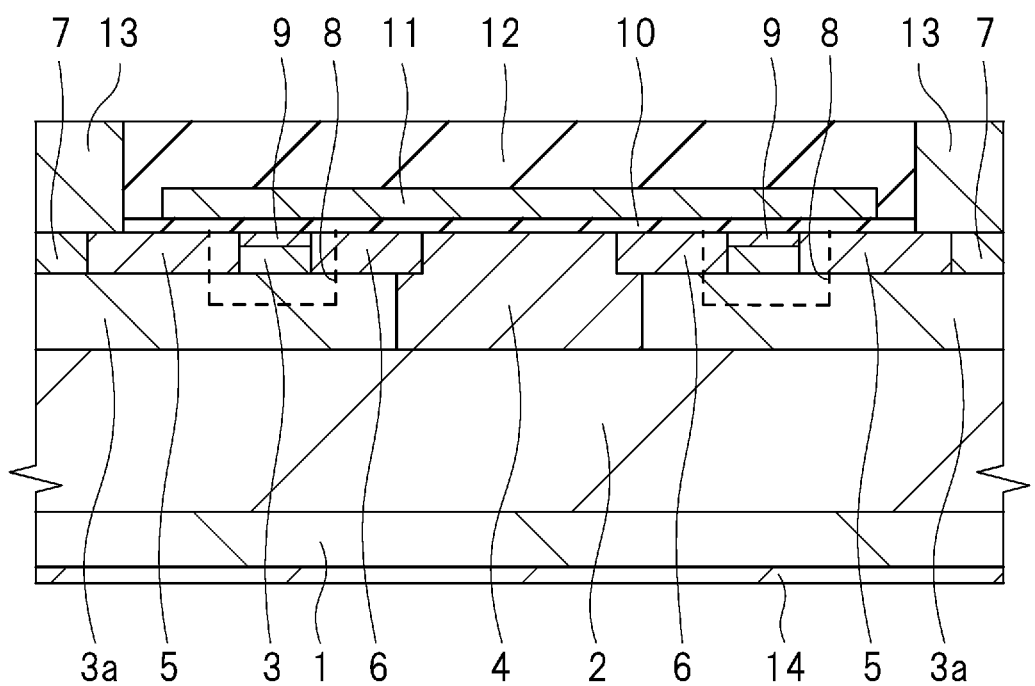
FIG. 9 is a cross-sectional view illustrating the semiconductor device according a first variation of the embodiment.

Hereinafter, a semiconductor device according to a first variation of the present embodiment will be described with reference to FIG. 9. FIG. 9 is a cross-sectional view illustrating the semiconductor device of the present variation. Similarly to FIG. 4, FIG. 9 is a cross-sectional view at a position corresponding to a cross section taken along line B-B in FIG. 2. Although the trench 8 does not overlap line B-B in FIG. 2, the trench 8 located behind the cross section taken along line B-B in the Y direction is indicated by a broken line in FIG. 9.

As illustrated in FIG. 9, in the present variation, the body layer 3 under the body layer contact region 7 is replaced with a semiconductor region 3a having higher p type impurity concentration than the body layer 3. That is, the p$^+$ type semiconductor region 3a is formed inside the epitaxial layer 2. The semiconductor region 3a is located below the source region 5, the current spreading region 6, and the body layer contact region 7. The body layer 3 is formed in a fin between the source region 5 and the current spreading region 6 on the semiconductor region 3a. The body layer contact region 7 and the body layer 3 in a fin are connected to the semiconductor region 3a. That is, the body layer 3 is electrically connected to the source plug 13 via the semiconductor region 3a and the body layer contact region 7.

The semiconductor region 3a is in contact with a bottom surface of the trench 8. That is, the semiconductor region 3a constitutes a bottom surface of the trench 8. Here, a part of the semiconductor region 3a is formed from a bottom surface of the trench 8 to a side surface of the trench 8. However, a large portion of a side surface of the trench 8 (side surface of a fin) in the Y direction is constituted by the body layer 3. Here, impurity concentration of the semiconductor region 3a is higher than impurity concentration of the body layer 3, and impurity concentration of the body layer contact region 7 is higher than impurity concentration of the semiconductor region 3a.

In a FinFET, potential of p type layers (the semiconductor region 9 and the body layer 3) on a side surface and a corner portion of a fin bypass the lower side of an n type layer (the source region 5) and is electrically connected to the source. For this reason, when high-speed switching is performed, body layer potential cannot follow source potential and may become unstable. On the other hand, in the present variation, by forming the semiconductor region 3a having higher concentration than the body layer 3 below the body layer 3 in a fin, resistance of a path between the body layer 3 and the body layer contact region 7 is lowered. By the above, it is possible to prevent body layer potential from failing to follow source potential and becoming unstable during high-speed switching operation. Specifically, the effect can be obtained by setting impurity concentration of the semiconductor region 3a to, for example, $1\times10^{18}$ $cm^{-3}$.

Further, in a case of a power MOSFET to which high voltage is applied, there is a possibility that electric field concentrates in a bottom portion of the trench 8 at the time of high-voltage blocking and the gate insulating film 10 is destroyed. Here, by increasing concentration of a body layer in a bottom portion of the trench 8 and forming the semiconductor region 3a, electric field concentration at the bottom portion is suppressed. By the above, the gate insulating film 10 can be prevented from being destroyed.

<Second Variation>

Figure 10:
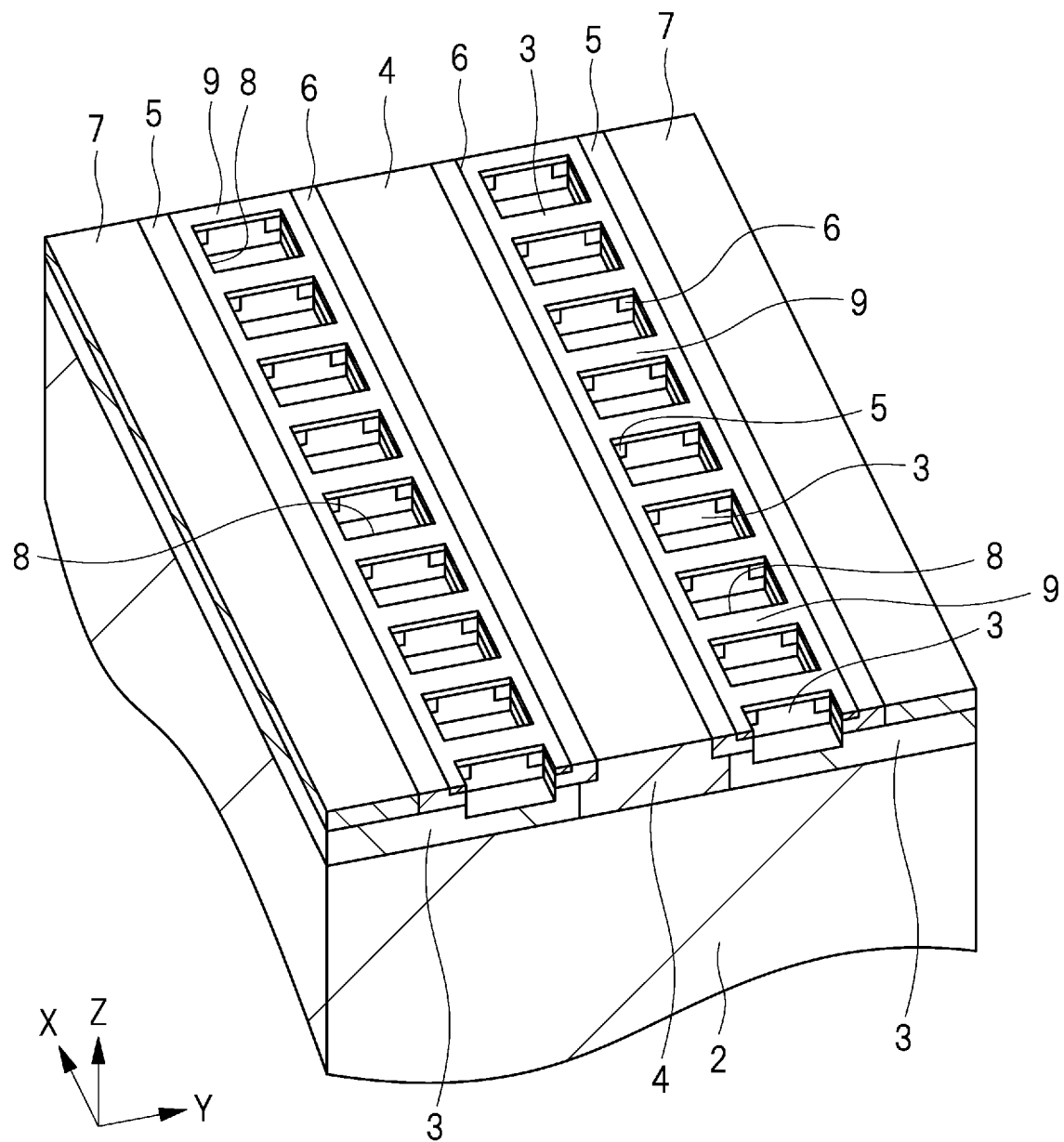
FIG. 10 is a bird's-eye view illustrating the semiconductor device according to the first variation of the embodiment.
Figure 11:
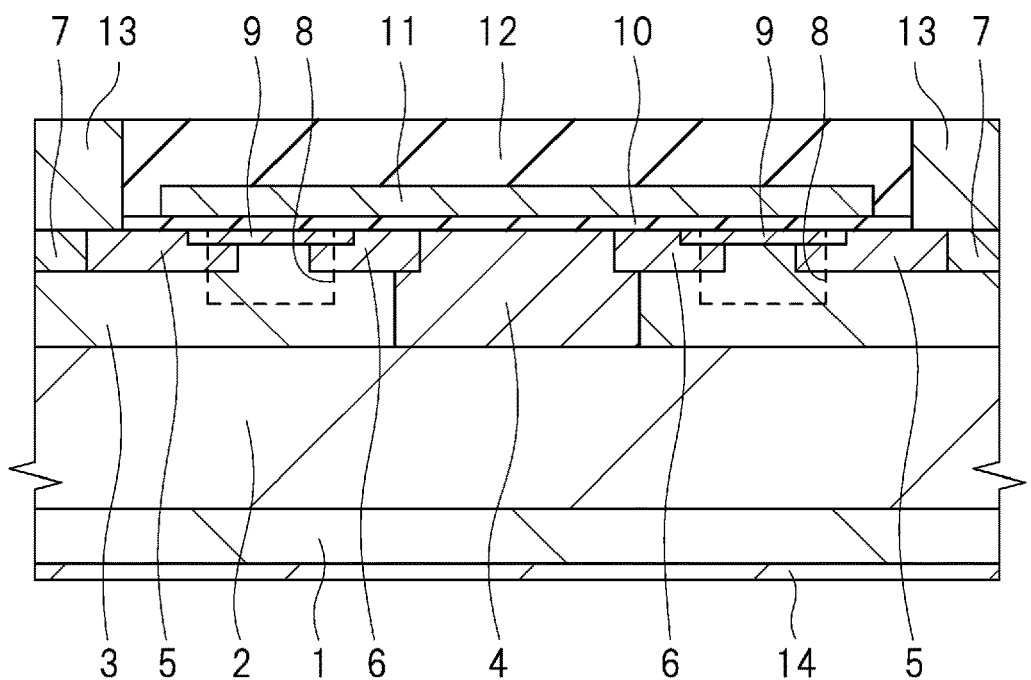
FIG. 11 is a cross-sectional view illustrating the semiconductor device according a second variation of the embodiment.

Hereinafter, a semiconductor device according to a second variation of the present embodiment will be described with reference to FIGS. 10 and 11. FIG. 10 is a bird's-eye view illustrating the semiconductor device of the present variation. FIG. 11 is a cross-sectional view illustrating the semiconductor device of the present variation. Similarly to FIG. 4, FIG. 11 is a cross-sectional view at a position corresponding to a cross section taken along line B-B in FIG. 2. In FIG. 11, as in FIG. 9, the trench 8 located behind the cross section taken along line B-B in the Y direction is indicated by a broken line.

As illustrated in FIGS. 10 and 11, in the present variation, both ends of the semiconductor region 9 extend to the outside of the body layer 3 in a fin immediately below the semiconductor region 9 in the X direction. In other words, an end portion of the semiconductor region 9 extends to immediately above an n type semiconductor region adjacent to the body layer 3 in a fin immediately below the semiconductor region 9 in the X direction.

Of both ends of the semiconductor region 9 formed at an upper end of a fin, one end portion is formed immediately above the source region 5 on the outer side in the X direction of the trench 8, and the other end portion is formed immediately above the current spreading region 6 on the outer side in the X direction of the trench 8. In other words, the semiconductor region 9 is formed from an upper end of the source region 5 on the outer side in the X direction of the trench 8 to an upper end of the current spreading region 6 on the outer side in the X direction of the trench 8. That is, both ends of the semiconductor region 9 are located in a region not overlapping the trench 8 in the Y direction. In this case, the semiconductor region 9 is formed over a corner portion of a fin, that is, the entire corner portion of a side surface of the trench 8 along the X direction. In other words, at a corner portion of a fin, the semiconductor region 9 is formed from one end portion to the other end portion of the fin in the X direction.

Figure 18:
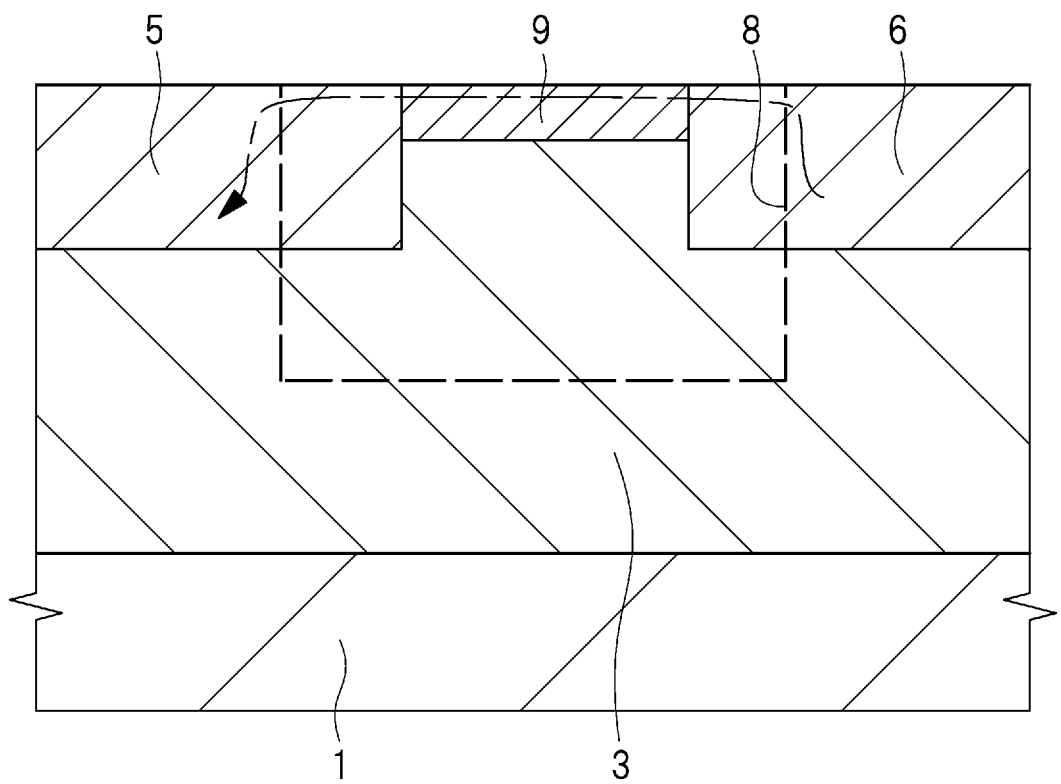
FIG. 18 is a cross-sectional view illustrating a current path of a parasitic channel in the semiconductor device as the comparative example.

As illustrated in FIG. 18 as a comparative example, a current path of a parasitic channel exists at a corner portion of a fin constituting a FinFET. FIG. 18 is a cross-sectional view illustrating a current path of a parasitic channel of a FinFET which is a comparative example by a broken line. Current of a parasitic channel flows from the current spreading region 6, which is an n type semiconductor region, to the source region 5, which is an n type semiconductor region, through the parasitic channel inverted to n type. In this way, a parasitic channel is formed at a corner portion of a fin (near a substrate surface). In view of the above, in the present variation, a p type semiconductor region (here, the semiconductor region 9) is arranged on an upper surface of an n type semiconductor region adjacent to the body layer 3 in a fin, so that a channel length of a parasitic channel is extended. By the above, a shielding effect of a parasitic channel can be obtained.

Here, it is important to prevent current from flowing by connecting a parasitic channel inverted to n type in a region adjacent to a gate electrode in the Y direction and the n type source region 5 and the current spreading region 6 to each other. Therefore, the semiconductor region 9 needs to be formed in a region adjacent to a gate electrode in the Y direction, which is a region where a parasitic channel may be formed. Therefore, here, the semiconductor region 9 reaches an end portion of a fin in the X direction. Further, an end portion of the semiconductor region 9 in the X direction desirably extends to a position not overlapping with the trench 8 in the Y direction.

When all corner portions of a fin are filled with a p type semiconductor region, there is no current path with a low threshold, and a large shielding effect of a parasitic channel is obtained.

Here, both ends of the semiconductor region 9 in the X direction extend to positions not overlapping the trench 8 in the Y direction. However, only one end portion of the both ends may extend to the position, and the other end portion may not extend and may terminate at the same position in the X direction as the body layer 3 immediately below the semiconductor region 9. That is, at least one of both ends of the semiconductor region 9 is preferably located in a region not overlapping the trench 8 in the Y direction. As described above, if a current path of a parasitic channel is cut off at one end portion of the semiconductor region 9, there is no current path with a low threshold, and a shielding effect of a parasitic channel is obtained.

<Third Variation>

Figure 12:
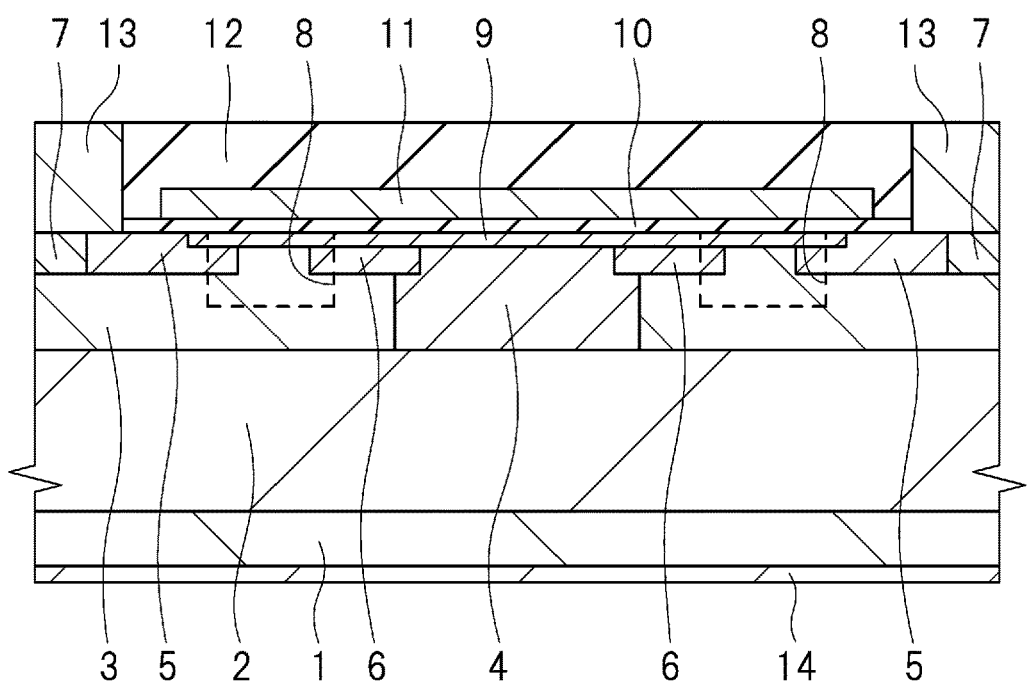
FIG. 12 is a cross-sectional view illustrating the semiconductor device according a third variation of the embodiment.

Hereinafter, a semiconductor device according to a third variation of the present embodiment will be described with reference to FIG. 12. FIG. 12 is a cross-sectional view illustrating the semiconductor device of the present variation. Similarly to FIG. 4, FIG. 12 is a cross-sectional view at a position corresponding to a cross section taken along line B-B in FIG. 2. In FIG. 12, the trench 8 located behind the cross section taken along line B-B in the Y direction is indicated by a broken line.

As illustrated in FIG. 12, in the present variation, the semiconductor region 9 extends between upper ends of fins adjacent to the trenches 8 adjacent to each other with the JFET region 4 interposed between them. That is, unlike the second variation, the semiconductor region 9 extending to the current spreading region 6 side is connected between fins adjacent to each other in the X direction. In other words, the semiconductor region 9 is formed from an upper surface of a fin to immediately above the JFET region 4, so that an upper surface of the current spreading region 6 and an upper surface of the JFET region 4 are covered with the semiconductor region 9 between fins adjacent to each other in the X direction. The semiconductor region 9 extending over the JFET region 4 can be used as an electric field relaxation layer.

The present variation can be suitably applied to a trench etched DMOS (TED-MOS) which is a SiC device. In the TED-MOS, it is conceivable to form a p type electric field relaxation layer on a JFET region on a JFET. An effect of the present embodiment can be easily obtained by extending the electric field relaxation layer to an upper portion of a body layer. Further, here, since the semiconductor region 9 extends from an upper end of a fin to the JFET region 4 side, a similar effect to that of the second variation can be obtained.

<Fourth Variation>

Figure 13:
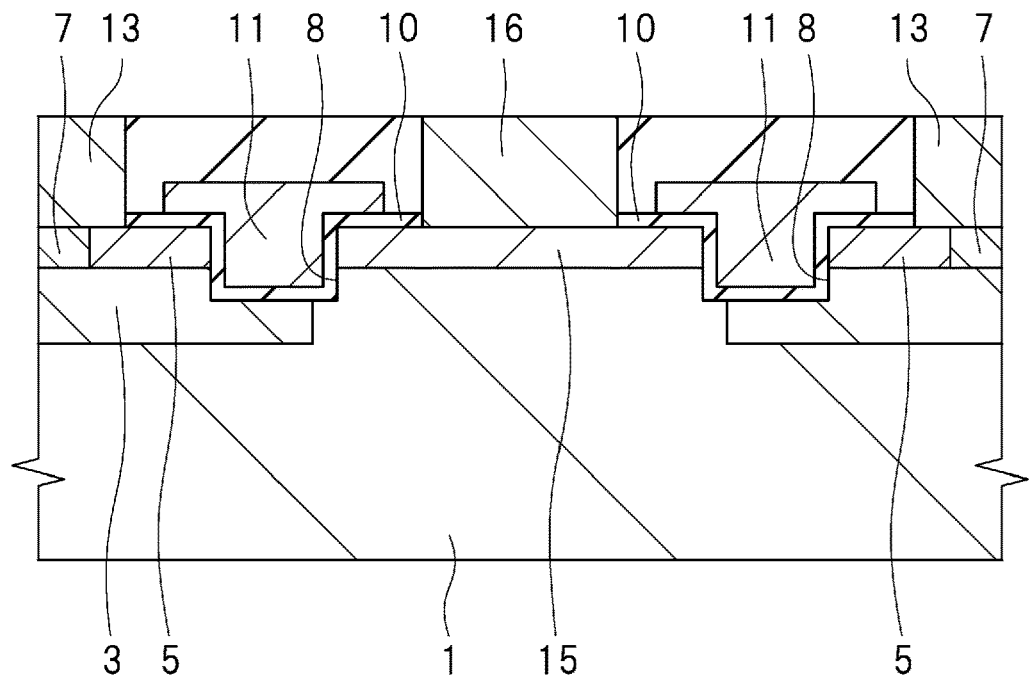
FIG. 13 is a cross-sectional view illustrating the semiconductor device according a fourth variation of the embodiment.
Figure 14:
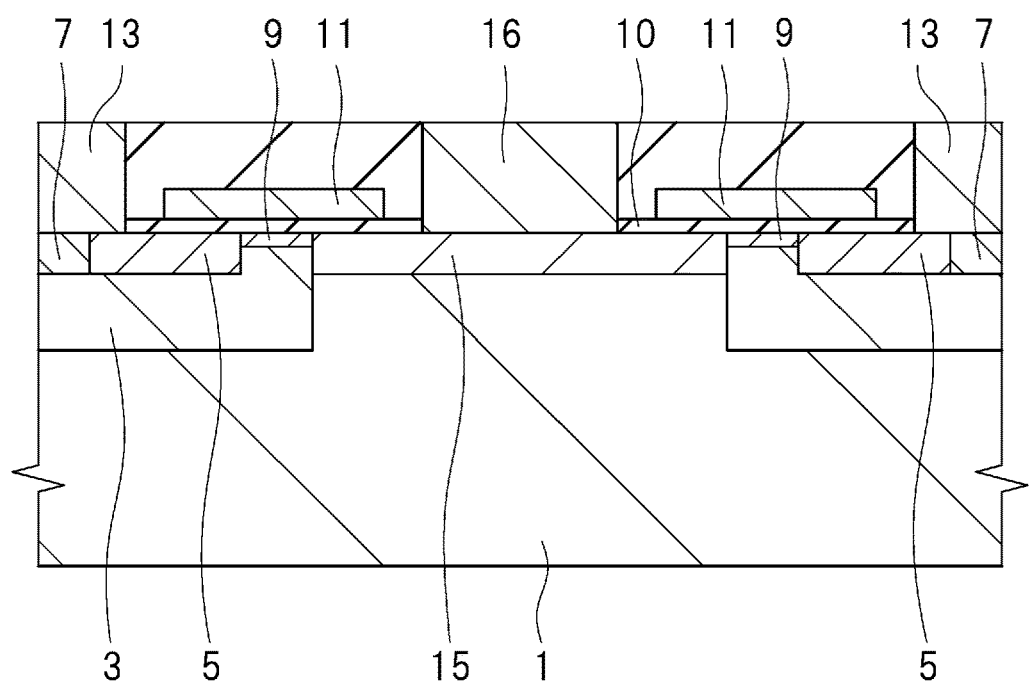
FIG. 14 is a cross-sectional view illustrating the semiconductor device according the fourth variation of the embodiment.

Hereinafter, a semiconductor device according to a fourth variation of the present embodiment will be described with reference to FIGS. 13 and 14. FIGS. 13 and 14 are cross-sectional views illustrating the semiconductor device of the present variation. Similarly to FIG. 3, FIG. 13 is a cross-sectional view at a position corresponding to a cross section taken along line A-A in FIG. 2. Similarly to FIG. 4, FIG. 14 is a cross-sectional view at a position corresponding to the cross section taken along line B-B in FIG. 2. That is, FIG. 13 illustrates the trench 8 and the gate electrode 11, and FIG. 14 illustrates a fin.

In FIGS. 1 to 4, a DMOS on the vertical side in which current flows from a lower surface to an upper surface of an epitaxial substrate is described. Here, a lateral MOSFET in which current flows from a drain region formed on an upper surface of an epitaxial substrate toward a source region will be described.

As illustrated in FIGS. 13 and 14, here, a case where the body layer 3, the JFET region 4, the source region 5, the body layer contact region 7, the trench 8, and the drain region 15 are formed on an upper surface of the SiC substrate 1 will be described, but the epitaxial layer 2 may be formed similarly to the structure illustrated in FIGS. 1 to 4. In the present variation, unlike the structure illustrated in FIGS. 1 to 4, the n⁺ type drain region 15 is formed instead of the current spreading region 6. A drain plug 16 insulated from the gate electrode 11 passes through the interlayer insulating film 12 immediately above the drain region 15. The drain plug 16 is electrically connected to the drain region 15.

The MOSFET of the present variation includes at least a fin including a channel formation region, the source region 5, the drain region 15, and the gate electrode 11 in the trench 8.

Here, current flows from the drain region 15 toward the source region 5. Such an element is not limited to a SiC device, and it is also conceivable that the element is formed on a semiconductor substrate mainly made from silicon (Si).

As described above, in addition to the vertical MOSFET, even in a case of a lateral MOSFET, an effect of the present embodiment can be obtained by forming the high-concentration semiconductor region 9 on an upper portion of the MOSFET having a fin.

Although the invention made by the present inventors is specifically described based on the embodiments, the present invention is not limited to the above-described embodiments, and various modifications can be made without departing from the gist of the present invention as a matter of course.

For example, a material, conductivity type, manufacturing condition, and the like of each part are not limited to those in the description of the above-described embodiment, and each part can be modified in many ways as a matter of course. Here, for convenience of description, a conductivity type of a semiconductor substrate and a semiconductor region is fixed, but the present invention is not limited to the conductivity type described in the above-described embodiment.

INDUSTRIAL APPLICABILITY

The present invention can be widely used in a semiconductor device having a trench structure.

REFERENCE SIGNS LIST

1 SiC substrate
2 epitaxial layer
3 body layer
4 JFET region
5 source region
6 current spreading region
7 body layer contact region
8 trench
9 semiconductor region
10 gate insulating film
11 gate electrode
12 interlayer insulating film
13 source plug
14 drain wiring electrode
15 drain region
16 drain plug

The invention claimed is:

1. A semiconductor device comprising:
a semiconductor substrate of a first conductivity type;
a plurality of trenches formed on an upper surface of the semiconductor substrate and arranged in a first direction;
a protruding portion protruding upward from a bottom surface of the trench between two of the trenches adjacent to each other in the first direction;
a first semiconductor region of a second conductivity type different from the first conductivity type, the first semiconductor region being formed in the protruding portion including a side surface of the protruding portion in the first direction;
a second semiconductor region of the second conductivity type that is formed at a corner portion which is an upper end of the side surface of the protruding portion and has impurity concentration twice or more than impurity concentration of the first semiconductor region;
a third semiconductor region of the first conductivity type connected to one end portion of the protruding portion in a second direction intersecting the first direction in plan view;
a fourth semiconductor region of the first conductivity type connected to another end portion of the protruding portion in the second direction; and
a gate electrode embedded inside each of a plurality of the trenches with a gate insulating film interposed therebetween, wherein
the gate electrode, the first semiconductor region, the third semiconductor region, and the fourth semiconductor region constitute a field effect transistor;
an end portion of the plurality of trenches on the second direction contacts to the third semiconductor region.

2. The semiconductor device according to claim 1, further comprising:
a fifth semiconductor region of the second conductivity type formed on the upper surface of the semiconductor substrate; and
a sixth semiconductor region of the second conductivity type formed on the bottom surface of the trench and electrically connected to the first semiconductor region and the fifth semiconductor region, wherein
impurity concentration of the sixth semiconductor region is higher than the impurity concentration of the first semiconductor region, and impurity concentration of the fifth semiconductor region is higher than the impurity concentration of the sixth semiconductor region.

3. The semiconductor device according to claim 1, wherein
an end portion of the second semiconductor region in the first direction is located immediately above the third semiconductor region or immediately above the fourth semiconductor region.

4. The semiconductor device according to claim 1, wherein the second semiconductor region is formed at the corner portion of the protruding portion from one end portion to another end portion of the protruding portion in the first direction.

5. The semiconductor device according to claim 1, wherein
a difference between a maximum value and a minimum value of threshold voltage of an upper surface of the protruding portion, threshold voltage of the corner portion, and threshold voltage of the side surface is 5 V or less.

6. The semiconductor device according to claim 1, wherein
a depth of the second semiconductor region from an upper surface of the protruding portion is larger than film thickness of the gate insulating film covering the side surface of the protruding portion.

7. The semiconductor device according to claim 6, wherein
the depth of the second semiconductor region is 200 nm or less.

8. The semiconductor device according to claim 1, wherein
the semiconductor substrate contains silicon carbide.

9. The semiconductor device according to claim 1, wherein
the third semiconductor region constitutes a source region, and
the fourth semiconductor region is electrically connected to a drain region formed on a bottom surface of the semiconductor substrate.

10. The semiconductor device according to claim 9, further comprising:
a seventh semiconductor region of the first conductivity type formed adjacent to the fourth semiconductor region in the semiconductor substrate, wherein
the third semiconductor region, the trench, the fourth semiconductor region, and the seventh semiconductor region are arranged in order in the second direction,
impurity concentration of the seventh semiconductor region is lower than impurity concentration of the fourth semiconductor region,
the fourth semiconductor region is electrically connected to the drain region via the seventh semiconductor region, and
the second semiconductor region is formed from an upper surface of the protruding portion to immediately above the seventh semiconductor region.

11. The semiconductor device according to claim 1, wherein
impurity concentration of the second semiconductor region gradually decreases from an upper surface of the protruding portion toward a lower surface of the second semiconductor region.

12. The semiconductor device according to claim 1, wherein
impurity concentration of the second semiconductor region is $1 \times 10^{18}$ to $1 \times 10^{19}$ cm$^{-3}$.

13. The semiconductor device according to claim 12, wherein
impurity concentration of the first semiconductor region is less than $5 \times 10^{17}$ cm$^{-3}$.

14. The semiconductor device according to claim 1, wherein
an another end portion of the plurality of trenches on the second direction contacts to the fourth semiconductor region.

* * * * *